(12) United States Patent
Takenaka

(10) Patent No.: US 12,274,111 B2
(45) Date of Patent: Apr. 8, 2025

(54) LIGHT-EMITTING ELEMENT AND LIGHT-EMITTING DEVICE

(71) Applicant: SHARP KABUSHIKI KAISHA, Sakai (JP)

(72) Inventor: Yukio Takenaka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 442 days.

(21) Appl. No.: 17/775,114

(22) PCT Filed: Nov. 19, 2019

(86) PCT No.: PCT/JP2019/045200
§ 371 (c)(1),
(2) Date: May 6, 2022

(87) PCT Pub. No.: WO2021/100104
PCT Pub. Date: May 27, 2021

(65) Prior Publication Data
US 2022/0416186 A1    Dec. 29, 2022

(51) Int. Cl.
*H10K 50/115*    (2023.01)
*C09K 11/02*    (2006.01)
(Continued)

(52) U.S. Cl.
CPC .......... *H10K 50/115* (2023.02); *C09K 11/025* (2013.01); *C09K 11/565* (2013.01);
(Continued)

(58) Field of Classification Search
CPC ....... H10K 50/115; H10K 50/15; H10K 50/16
See application file for complete search history.

(56) References Cited

U.S. PATENT DOCUMENTS

2006/0063029 A1    3/2006    Jang et al.
2009/0236983 A1    9/2009    Jang et al.
(Continued)

FOREIGN PATENT DOCUMENTS

JP    2005-340195 A    12/2005
JP    2019-165006 A    9/2019

OTHER PUBLICATIONS

Wei zou et al., "Minimising efficiency roll-off in high-brightness perovskite light-emitting diodes", Nature Communications vol. 9, Article No. 608 (2018), DOI: 10.1038/s41467-018-03049-7 |www.nature.com/naturecommunications, Feb. 9, 2018.

*Primary Examiner* — C Melissa Koslow
(74) *Attorney, Agent, or Firm* — ScienBiziP, P.C.

(57) ABSTRACT

A light-emitting element includes: a cathode; an anode; a light-emitting layer provided between the cathode and the anode and containing quantum dots; an electron-transport layer provided between the light-emitting layer and the cathode; and a hole-transport layer provided between the light-emitting layer and the anode. The light-emitting layer includes a first light-emitting layer containing first quantum dots to which first ligands are coordinated, and further includes a second light-emitting layer provided closer to the electron-transport layer than to the first light-emitting layer, and containing second quantum dots to which second ligands are coordinated. A dipole moment of the first ligands is larger than a dipole moment of the second ligands.

9 Claims, 8 Drawing Sheets

(51) Int. Cl.
*C09K 11/56* (2006.01)
*C09K 11/88* (2006.01)
*H10K 50/15* (2023.01)
*H10K 50/16* (2023.01)

(52) U.S. Cl.
CPC ............ *C09K 11/883* (2013.01); *H10K 50/15* (2023.02); *H10K 50/16* (2023.02)

(56) References Cited

U.S. PATENT DOCUMENTS

| | | |
|---|---|---|
| 2012/0225542 A1 | 9/2012 | Jang et al. |
| 2012/0267616 A1 | 10/2012 | Jang et al. |
| 2017/0190966 A1 | 7/2017 | Jang et al. |
| 2019/0326539 A1* | 10/2019 | Chung .................. H10K 59/12 |
| 2021/0226172 A1 | 7/2021 | Chung et al. |

\* cited by examiner

--PRIOR ART--

--PRIOR ART--

LIGHT-EMITTING ELEMENT AND LIGHT-EMITTING DEVICE

TECHNICAL FIELD

The disclosure relates to a light-emitting element containing quantum dots, and a light-emitting device including the light-emitting element.

BACKGROUND ART

Patent Document 1 discloses a light-emitting element including a light-emitting layer containing a plurality of nanoparticle thin films stacked one another.

CITATION LIST

Patent Literature

[Patent Document 1] Japanese Unexamined Patent Application Publication No. 2005-340195

Non Patent Literature

[Non Patent Document 1] Nature Communications volume 9, Article number: 608 (2018)

SUMMARY

Technical Problem

Patent Document 1 discloses a technique to improve light emission efficiency of a light-emitting element. In Patent Document 1, the light-emitting element includes light-emitting layers each containing nanocrystals; namely, for example, quantum dots (semiconductor nanoparticles). The particle size of the quantum dots is designed to gradually increase from toward the cathode to toward the anode. Hence, as described in Non Patent Document 1, an energy gap of the light-emitting layers decreases from toward the cathode to toward the anode, thereby forming a potential well. As a result, the light emission efficiency of the light-emitting element improves.

In the above configuration, however, the particle size of the quantum dots in the light-emitting layers is larger toward the anode, such that a particle count of the quantum dots is small per unit cross-sectional area. That is, the density of the quantum dots is low. In a typical light-emitting element whose light-emitting layer contains quantum dots, an exciton is likely to form toward the anode of the light-emitting layer. In Patent Document 1, the density of the quantum dots is low toward the anode of the light-emitting layer, and the efficiency in forming the exciton decreases. As a result, the total light emission efficiency of the light-emitting element decreases.

Solution to Problems

In order to solve the above problems, a light-emitting element according to an aspect of the disclosure includes: a cathode; an anode; a light-emitting layer provided between the cathode and the anode and containing quantum dots; an electron-transport layer provided between the light-emitting layer and the cathode; and a hole-transport layer provided between the light-emitting layer and the anode, wherein the light-emitting layer includes a first light-emitting layer containing first quantum dots to which first ligands are coordinated, the light-emitting layer further includes a second light-emitting layer provided closer to the electron-transport layer than to the first light-emitting layer, and containing second quantum dots to which second ligands are coordinated, and a dipole moment of the first ligands is larger than a dipole moment of the second ligands.

Advantageous Effect of Disclosure

An aspect of the disclosure can provide a light-emitting element including a light-emitting layer. The light-emitting layer includes a potential well and contains quantum dots in sufficient density toward an anode of the light-emitting layer, so that the light-emitting element improves in light emission efficiency.

DESCRIPTION OF EMBODIMENTS

First Embodiment

Figure 1:
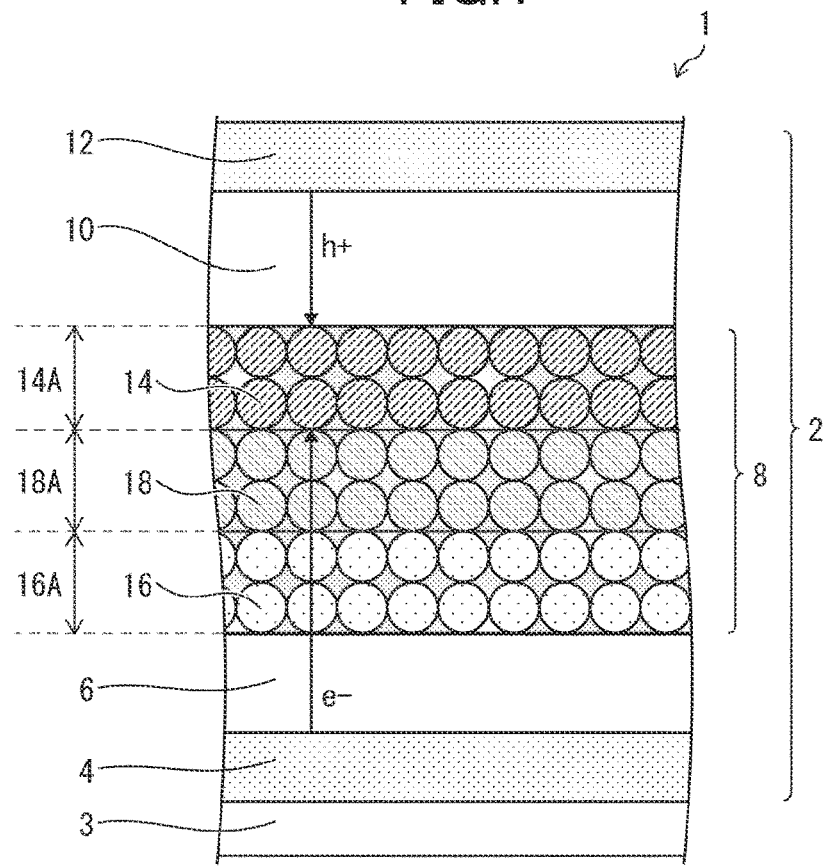
FIG. 1 is a schematic cross-sectional view of a light-emitting device according to a first embodiment of the disclosure.

FIG. 1 is a schematic cross-sectional view of a light-emitting device 1 according to this embodiment. As illustrated in FIG. 1, the light-emitting device 1 according to this embodiment includes: a light-emitting element 2; and an array substrate 3. The light-emitting device 1 is structured to include the array substrate 3 formed of not-shown thin-film transistors (TFTs), and the light-emitting element 2 multi-layered and stacked on the array substrate 3. Note that, in this DESCRIPTION, a direction from the light-emitting element 2 toward the array substrate 3 in the light-emitting device 1 is referred to as a "downward direction", and a direction from the array substrate 3 toward the light-emitting element 2 in the light-emitting device 1 is referred to as an "upward direction".

The light-emitting element 2 includes: an electron-transport layer 6; a light-emitting layer 8; a hole-transport layer 10; and an anode 12, all of which are provided on a cathode 4 in the stated order from below. The light-emitting element 2 is formed above the array substrate 3. The cathode 4 of the light-emitting element 2 is electrically connected to the TFTs of the array substrate 3. For a light-emitting element according to another embodiment, an anode may be provided above an array substrate. Such a light-emitting element may include: a hole-transport layer, a light-emitting layer; an electron-transport layer, and a cathode, all of which are provided on the anode in the stated order.

Described in detail below are the layers of the light-emitting element 2.

The cathode 4 and the anode 12, containing a conductive material, are respectively and electrically connected to the electron-transport layer 6 and the hole-transport layer 10.

Either the first electrode 1 or the anode 12 is a transparent electrode. The transparent electrode may be made of, for example, ITO, IZO, ZnO, AZO, BZO, or FTO, and deposited by, for example, sputtering. Moreover, either the cathode 4 or the anode 12 may contain a metallic material. The metallic material preferably includes such a substance as Al, Cu. Au, Ag, or Mg that is high in reflectance of visible light. The metallic material preferably includes either such a substance alone, or an alloy of the substances.

The electron-transport layer 6 transports electrons from the cathode 4 to the light-emitting layer 8. As is known, other than $TiO_2$, the electron-transport layer 6 can be made of an organic material or an inorganic material used for light-emitting elements or organic EL light-emitting elements containing quantum dots. The organic material of the electron-transport layer 6 may be a conductive compound such as Alq3, BCP, or t-Bu-PBD. The inorganic material of the electron-transport layer 6 may be a metallic oxide such as ZnO, ZAO, ITO, IGZO, or an electride. In particular, the material of the hole-transport layer 6 is preferably low in electron affinity.

The hole-transport layer 10 transports holes from the anode 12 to the light-emitting layer 8. As is known, the hole-transport layer 10 can be made of an organic material or an inorganic material used for light-emitting elements or organic EL light-emitting elements containing quantum dots. The organic material of the hole-transport layer 10 may be a conductive compound such as CBP, PPV, PEDOT-PSS, TFB, or PVK. The inorganic material of the hole-transport layer 10 may be a metallic oxide such as molybdenum oxide, NiO, $Cr_2O_3$, MgO, MgZnO, $LaNiO_3$, or $WO_3$. In particular, the material of the hole-injection layer 10 is preferably high in electron affinity and ionization potential.

In this embodiment, the electron-transport layer 6 and the hole-transport layer 10 are made of the above materials and formed by such a technique as vapor deposition, sputtering, or application of colloidal solution. Moreover, the light-emitting element 2 may include: an electron-injection layer between the cathode 4 and the electron-transport layer 6; and a hole-injection layer between the anode 12 and the hole-transport layer 10. Furthermore, the light-emitting element 2 may include an intermediate layer either between the electron-transport layer 6 and the light-emitting layer 8, or between the hole-transport layer 10 and the light-emitting layer 8. Any of the electron-injection layer, the hole-injection layer, and the intermediate layer may be formed by the same technique by which the electron-transport layer 6 or the hole-transport layer 10 is formed.

The light-emitting layer 8 is a quantum dot layer including multilayered quantum dots (semiconductor nanoparticles). In this embodiment, the light-emitting layer 8 includes: a first light-emitting layer 14A provided closer to the hole-transport layer 10, and containing first quantum dots 14; and a second light-emitting layer 16A provided closer to the electron-transport layer 6 than to the first light-emitting layer 14A, and containing second quantum dots 16. In addition, in this embodiment, the light-emitting layer 8 includes a third light-emitting layer 18A containing third quantum dots 18, and provided between the first light-emitting layer 14A and the second light-emitting layer 16A.

In the light-emitting element 2 of this embodiment, the first light-emitting layer 14A and the hole-transport layer 10 are adjacent to each other, and the second light-emitting layer 16A and the electron-transport layer 6 are adjacent to each other. Moreover, in a light-emitting element of another embodiment, the third light-emitting layer 18A may be omitted, and the first light-emitting layer 14A and the second light-emitting layer 16A may be adjacent to each other.

Here, as illustrated in FIG. 1, the first quantum dots 14, the second quantum dots 16, and the third quantum dots 18 in the light-emitting layer 8 do not have to be regularly arranged. The first quantum dots 14, the second quantum dots 16, and the third quantum dots 18 may be contained irregularly in the light-emitting layer 8. The light-emitting layer 8 preferably has a film thickness ranging approximately from 2 to 100 nm.

Figure 2:
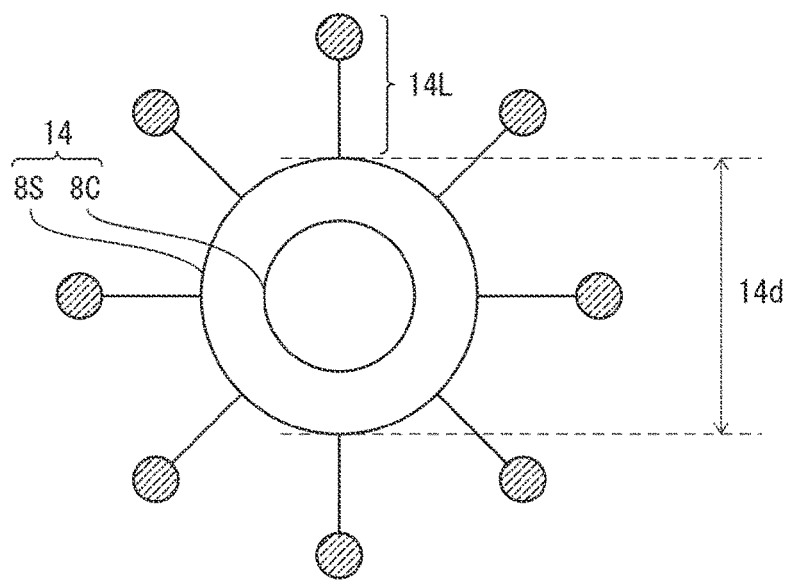
FIG. 2 is an enlarged schematic view of a first quantum dot according to the first embodiment of the disclosure.
Figure 3:
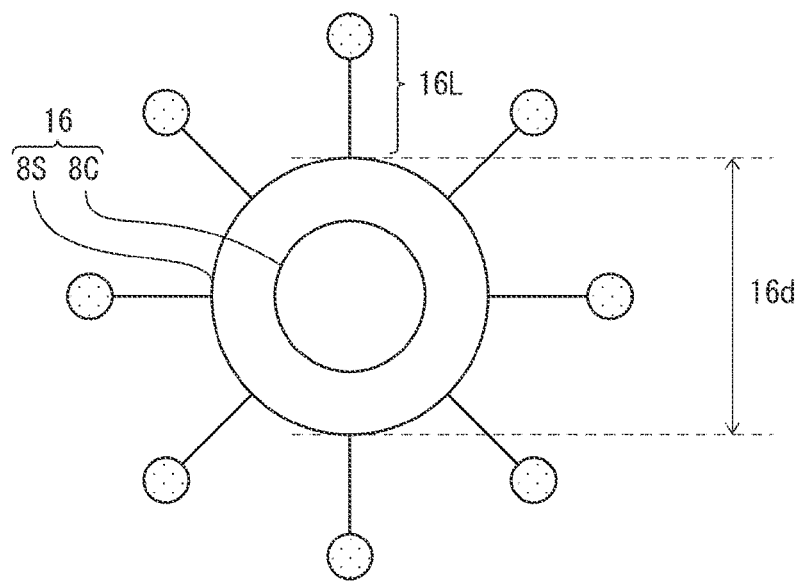
FIG. 3 is an enlarged schematic view of a second quantum dot according to the first embodiment of the disclosure.
Figure 4:
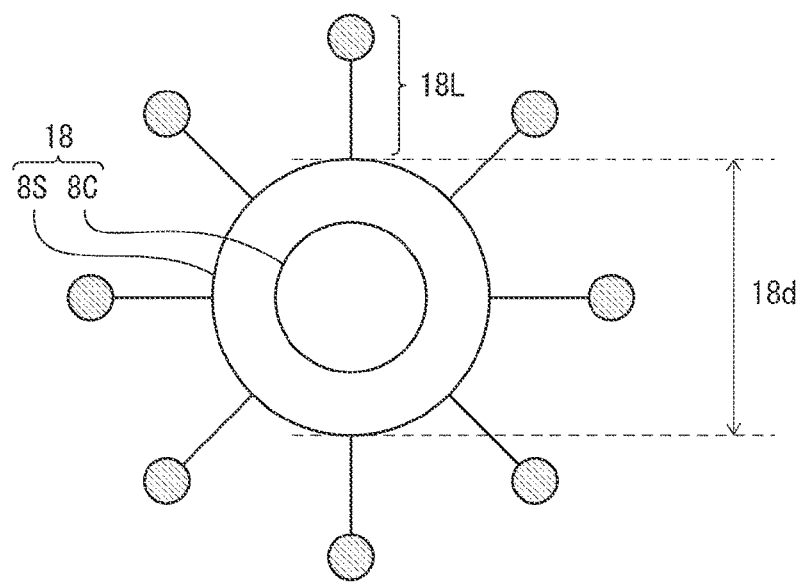
FIG. 4 is an enlarged schematic view of a third quantum dot according to the first embodiment of the disclosure.

Described below with reference to FIGS. 2 to 4 are a first quantum dot 14, a second quantum dot 16, and a third quantum dot 18 included in the light-emitting layer 8 according to this embodiment. FIG. 2 is a schematic cross-sectional view of the first quantum dot 14. FIG. 3 is a schematic cross-sectional view of the second quantum dot 16. FIG. 4 is a schematic cross-sectional view of the third quantum dot 18.

Any of the first quantum dot 14, the second quantum dot 16, and the third quantum dot 18 is a core/shell quantum dot including: a core 8C; and a shell 8S formed around the core 8C. In view of efficient injection of carriers from outside the shell 8S into the core 8C in this embodiment, the shell 8S is wider in bandgap than the core 8C. The shell 8S is capable of reducing, for example, flaws or dangling bond of the core 8C, and of curbing recombination of carriers undergoing deactivation.

Each of the first quantum dot 14, the second quantum dot 16, and the third quantum dot 18 may be a semi-cadmium-based conductive nanoparticle including: the core 8C made of CdSe; and the shell 8S made of ZnS. Other than that, the first quantum dot 14, the second quantum dot 16, and the third quantum dot 18 may also include CdSe/CdS, InP/ZnS, ZnSe/ZnS, or CIGS/ZnS in the form of a core/shell structure. Note that the shell 8S may be formed of a plurality of layers made of different materials. Moreover, the first quantum dot 14, the second quantum dot 16, and the third quantum dot 18 may contain a compound having a perovskite crystal structure. An example of the compound includes $CsPbBr_3$ or $Cs_2NaAgIn_2Cl_6$.

Each of the first quantum dot 14, the second quantum dot 16, and the third quantum dot 18 has a valence band level and a conduction band level. In this embodiment, at least the first quantum dot 14 is a light-emitting material emitting light by recombination of holes in the valence band level and electrons in the conduction band level. The light emitted from the first quantum dot 14 has a narrow spectrum because of the quantum confinement effect. Hence, the emitted light can be relatively high in chromaticity.

Each of the first quantum dot 14, the second quantum dot 16, and the third quantum dot 18 has a particle size ranging approximately from 2 to 15 nm. A wavelength of the light emitted from the first quantum dot 14 can be controlled with the particle size of the first quantum dot 14. In particular, the first quantum dot 14 has a core/shell structure. Thus, when the particle size of the core 8C of the first quantum dot 14 is controlled, the wavelength of the light emitted from the first quantum dot 14 can be controlled. Hence, when the particle size of the core 8C of the first quantum dot 14 is controlled, the wavelength of the light emitted from the light-emitting device 1 can be controlled.

Here, as illustrated in FIG. 2, the first quantum dot 14 has a particle size 14d. Likewise, as illustrated in FIG. 3, the second quantum dot 16 has a particle size 16d, and, as illustrated in FIG. 4, the third quantum dot 18 has a particle size 18d. In this embodiment, for the sake of brevity, any of the particle size 14d, the particle size 16d, and the particle size 18d is an average particle size of the respective quantum dots.

In this embodiment, the particle size 14d, the particle size 16d, and the particle size 18d are the same. That is, the first quantum dots 14, the second quantum dots 16, and the third quantum dots 18 are the same in average particle size. Thus, the first light-emitting layer 14A, the second light-emitting layer 16A, and the third light-emitting layer 18A are also the same in density of the respective quantum dots.

Note that, in this DESCRIPTION, the statement "the same in particle size" allows such differences as variations in the particle size caused in producing the cores 8C and the shells 8S of the quantum dots. Specifically, if the difference between the particle size 14d and the particle size 16d is, for example, within 10 percent, the average particle size may be deemed the same between the first quantum dots 14 and the second quantum dots 16 in this DESCRIPTION. The average particle size of the first quantum dots 14 and the second quantum dots 16 may be measured with a scanning electron microscope (SEM). The "average particle size" of the semiconductor quantum dots of this DESCRIPTION is a number average particle size unless otherwise noted. The average particle size is an average value of the particle sizes of 10 quantum dots arbitrarily selected on an observation screen of the SEM.

If the difference between the particle size 14d and the particle size 16d is within 10 percent, a difference in peak wavelength of emitted light between the first quantum dot 14 and the second quantum dot 16 can be reduced to approximately 5 nm. In other words, if the difference in peak wavelength of emitted light between the first quantum dot 14 and the quantum dot 16 is 5 nm or less, the particle size of the cores may be deemed the same between the first quantum dot 14 and the second quantum dot 16.

In this embodiment, the cores 8C may be produced of the same material and the shells 8S may be produced of the same material for the first quantum dots 14, the second quantum dots 16, and the third quantum dots 18. Such features make it possible to produce the first quantum dots 14, the second quantum dots 16, and the third quantum dots 18 at the same step, and to easily equalize the average particle sizes of the first, second, and third quantum dots 14, 16, and 18. Note that, using a known technique, the produced first quantum dots 14 allow various kinds of ligands to coordinate thereto without changing the particle size.

In this embodiment, as illustrated in FIG. 2, first ligands 14L are coordinated to the shell 8S of the first quantum dot 14. Moreover, in this embodiment, second ligands 16L are coordinated to the shell 8S of the second quantum dot 16 as illustrated in FIG. 3, and third ligands 18L are coordinated to the shell 8S of the third quantum dot 18 as illustrated in FIG. 4.

In this embodiment, the first ligands 14L are made of electron-withdrawing molecules. That is, the first ligands 14L have a relatively large dipole moment. Moreover, the dipole moment of the first ligands 14L may be of a positive value.

Specifically, the first ligands 14L have a structure represented by any one of formulae (1) to (5):

[Formula 1]

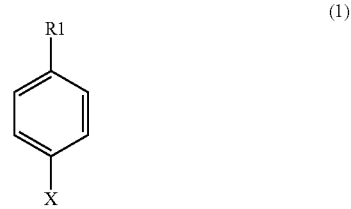

(1)

[Formula 2]

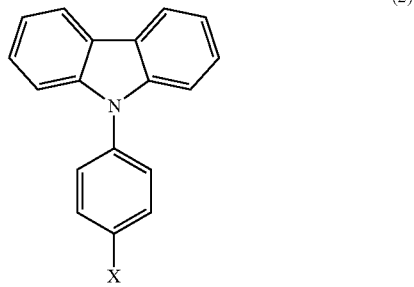

(2)

[Formula 3]

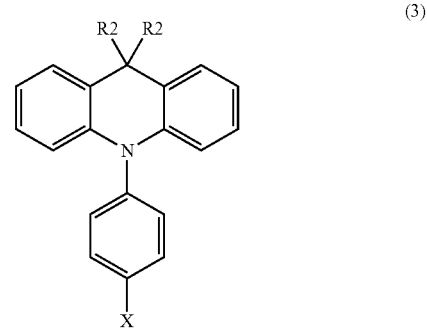

(3)

[Formula 4]

(4)

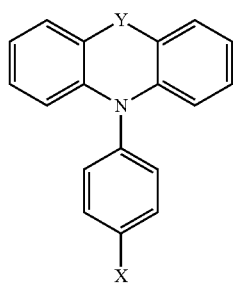

[Formula 5]

(5)

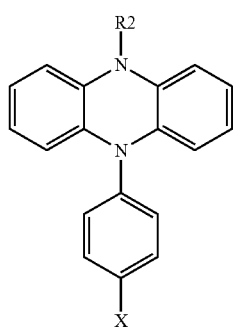

[Formula 7]

(7)

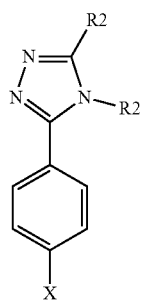

[Formula 8]

(8)

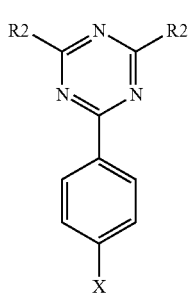

Wherein, in the formulae (1) to (5), X represents a functional group selected from a thiol group, a carboxyl group, and an amino group, and coordinated to the first quantum dot, and R1 has a nitrogen-containing aromatic ring selected from at least one of a carbazole skeleton, an acridine skeleton, a phenoxazone skeleton, and a phenazine skeleton. A nitrogen atom forming the nitrogen-containing aromatic ring of R1 binds to a benzene ring expressed by the formula (1). R2 may be equal to or different from each other, and are selected from hydrogen atoms, an alkyl group, and a phenyl group. Y represents an atom of O or an atom of S.

The first ligands 14L having a structure of any one of the formulae (1) to (5) are potential-withdrawing, and especially have a positive dipole moment.

Meanwhile, in this embodiment, the second ligands 16L are made of electron-donating molecules. That is, the second ligands 16L have a relatively small dipole moment. In particular, the dipole moment of the first ligands 14L is larger than the dipole moment of the second ligands 16L. Moreover, the dipole moment of the second ligands 16L may be of a negative value.

Specifically, the second ligands 16L have a structure represented by any one of formulae (6) to (11):

[Formula 6]

(6)

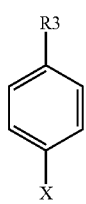

[Formula 9]

(9)

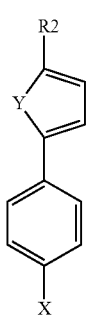

[Formula 10]

(10)

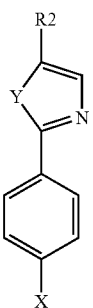

[Formula 11]

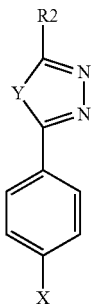

(11)

Wherein, in the formulae (6) to (11), X represents a functional group selected from a thiol group, a carboxyl group, and an amino group, and coordinated to the first quantum dot, and R2 may be equal to or different from each other, and are selected from hydrogen atoms, an alkyl group, and a phenyl group. R3 is selected from any one or more of functional groups including a triazole skeleton, a triazine skeleton, a thiophene skeleton, a furan skeleton, a thiazole skeleton, an oxazole skeleton, an oxadiazole skeleton, and a thiadiazole skeleton. Y represents an atom of O or an atom of S.

The second ligands 16L having a structure of any one of the formulae (6) to (11) are electron-donating, and especially have a negative dipole moment.

Note that, in this embodiment, the third ligands 18L are made of neutral molecules that are neither electron-withdrawing nor electron-donating. That is, the dipole moment of the third ligands 18L is smaller than the dipole moment of the first ligands 14L, and is larger than the dipole moment of the second ligands 16L. Moreover, the dipole moment of the third ligands 18L may be of a value of approximately 0.

The third ligands 18L have a structure represented by a formula (12) below:

[Formula 12]

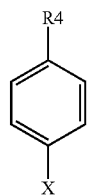

(12)

Wherein, in the formula (12), X represents a functional group selected from a thiol group, a carboxyl group, and an amino group, and coordinated to the first quantum dot, and R4 is selected from a phenyl group and a biphenyl group.

The third ligands 18L having a structure of the above formula (12) are neither electron-withdrawing nor electron-donating, and have a dipole moment of approximately 0.

Figure 5:
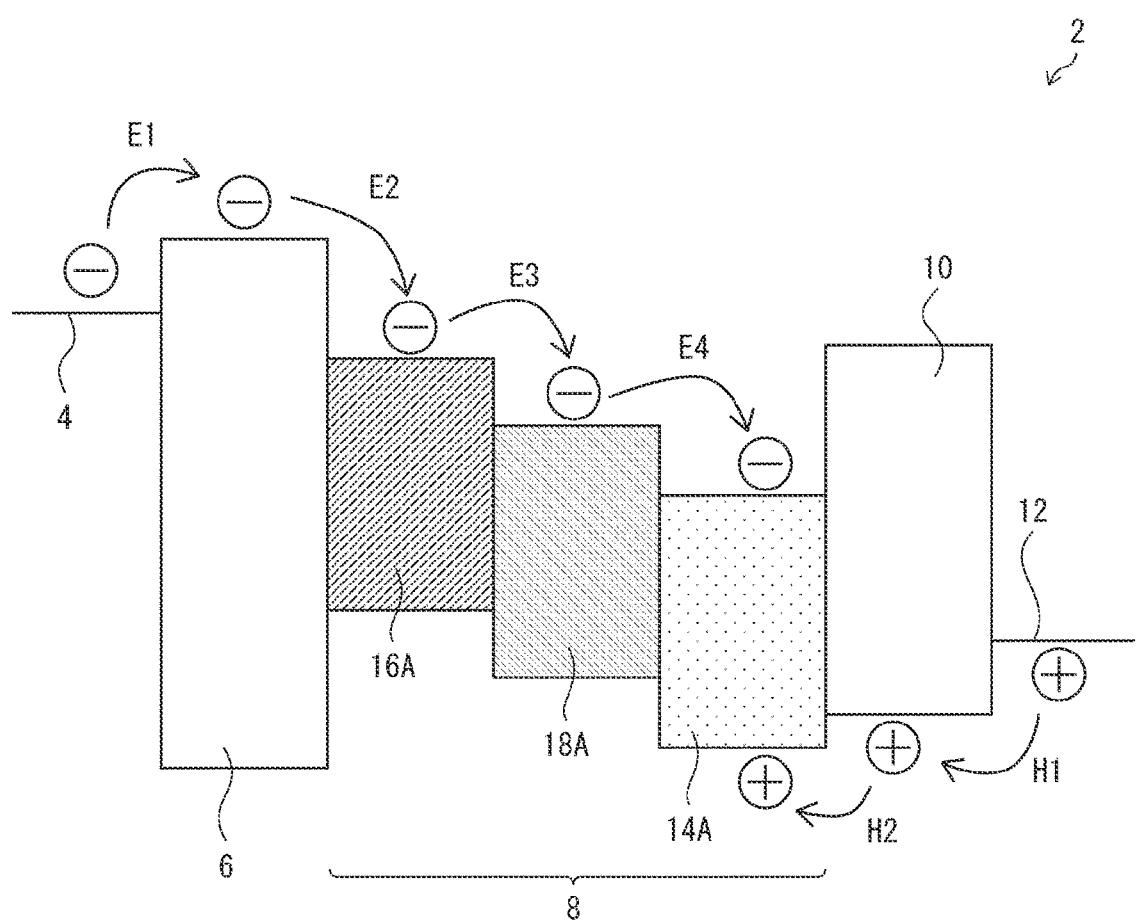
FIG. 5 is an energy band diagram illustrating a Fermi level or a bandgap of each of the layers included in a light-emitting element according to the first embodiment of the disclosure. The energy band diagram also illustrates how carriers are transported.

FIG. 5 is an energy band diagram illustrating a Fermi level or a bandgap of each of the layers included in the light-emitting element 2 according to this embodiment.

Note that, in the energy band diagrams of this DESCRIPTION, energy levels of the layers are indicated with reference to a vacuum level. Moreover, in the energy band diagrams of this DESCRIPTION. Fermi levels or bandgaps are those of members corresponding to the assigned reference numerals.

In the energy band diagrams of this DESCRIPTION, Fermi levels are indicated for the cathode 4 and the anode 12. Moreover, in the energy band diagrams of this DESCRIPTION, bandgaps are indicated for the layers including the electron-transport layer 6 to the hole-transport layer 10. Note that the bandgap of each layer corresponds to either a difference between a bottom of the conduction band and a top of the valence band of, or a difference between a LUMO level and a HOMO level of, the layer.

Typically, the width of the bandgap of a light-emitting layer containing quantum dots depends on the particle size of the quantum dots. The larger the particle size of the quantum dots is, the wider the bandgap is. In this embodiment, however, the average particle size is the same among the quantum dots in the light-emitting layer 8 as described above. Hence, as clearly seen in FIG. 5, the width of the bandgap is the same between the first light-emitting layer 14A, the second light-emitting layer 16A, and the third light-emitting layer 18A.

Here, in the light-emitting layer containing the quantum dots to which the ligands are coordinated, the dipole moment of the ligands is controlled so that the energy on the bottom of the conduction band of, and on the top of the valence band of, the light-emitting layer can be controlled.

Specifically, if the ligands are electron-withdrawing and have a relatively large dipole moment, the energy, on the bottom of the conduction band and on the top of the valence band of the light-emitting layer containing the quantum dots to which the ligands are coordinated, is pulled down away from the vacuum level. Meanwhile, if the ligands are electron-donating and have a relatively small dipole moment, the energy, on the bottom of the conduction band and on the top of the valence band of the light-emitting layer containing the quantum dots to which the ligands are coordinated, is pulled up toward the vacuum level.

Hence, in the energy band diagram in FIG. 5, the bottom of the conduction band of the first light-emitting layer 14A is lower than the bottom of the conduction band of the second light-emitting layer 16A, and the top of the valence band of the first light-emitting layer 14A is lower than the top of the valence band of the second light-emitting layer 16A. Moreover, in the energy band diagram in FIG. 5, the bottom of the conduction band of the third light-emitting layer 18A is in between the bottom of the conduction band of the first light-emitting layer 14A and the bottom of the conduction band of the second light-emitting layer 16A. Likewise, the top of the valence band of the third light-emitting layer 18A is in between the top of the valence band of the first light-emitting layer 14A and the top of the valence band of the second light-emitting layer 16A.

Note that, as illustrated in FIG. 5 in this DESCRIPTION, a value of the level of the bottom of the conduction band of the first light-emitting layer 14A is smaller than a value of a LUMO level of the hole-transport layer 10. Moreover, a value of the level of the bottom of the conduction band of the second light-emitting layer 16A is smaller than a value of a LUMO level of the electron-transport layer 6.

Described next with reference to FIG. 5 is how carriers are transported in the light-emitting element 2. For example, the TFTs of the array substrate 3 are driven to produce a potential difference between the cathode 4 and the anode 12. Hence, the electrons and the holes are generated respectively from the cathode 4 and the anode 12. As an arrow E1 indicates, the electrons from the cathode 4 are injected into the electron-transport layer 6. As an arrow H1 indicates, the holes from the anode 12 are injected into the hole-transport layer 10.

As an arrow E2, an arrow E3, and an arrow E4 indicate, the electrons injected into the electron-transport layer 6 are sequentially transported to the second light-emitting layer 16A, the third light-emitting layer 18A, and the first light-emitting layer 14A. Moreover, as an arrow H2 indicates, the holes injected into the hole-transport layer 10 are transported to the first light-emitting layer 14A.

Here, in the light-emitting element 2, while the holes from the anode 12 are transported to the first light-emitting layer 14A, the electrons from the cathode 4 are transported through the second light-emitting layer 16A and the third light-emitting layer 18A to the first light-emitting layer 14A. This happens because, in the light-emitting layer 8, the mobility of the electrons is greater with respect to the mobility of the holes. Hence, the electrons and the holes transported to the first light-emitting layer 14A recombine together in the first quantum dots 14 and generate an exciton, and the first light-emitting layer 14A generates light having energy corresponding to the width of the bandgap of the first light-emitting layer 14A.

Here, in the light-emitting element 2 according to this embodiment, the level to the top of the bandgap gradually decreases from the electron-transport layer 6 to the first light-emitting layer 14A. Moreover, as described above, the value of the level of the bottom of the conduction band of the first light-emitting layer 14A is smaller than the value of the LUMO level of the hole-transport layer 10. Hence, in this embodiment, the light-emitting layer 8 is provided practically with a multiple quantum well of the electrons.

As described in Non Patent Document 1, the light emission efficiency of a light-emitting element having a multiple quantum well structure improves in accordance with improvement in efficiency in transportation and recombination of the carriers. Thus, because of the improvement in the efficiency in transportation of the carriers to the first light-emitting layer 14A, and in recombination of the carriers in the first light-emitting layer 14A, the light-emitting element 2 according to this embodiment also exhibits improvement in light emission efficiency.

As described in Non Patent Document 1, in order to produce a light-emitting element having a multiple quantum well structure, a possible technique is to gradually reduce the width of the bandgap of each of the light-emitting layers from toward the cathode to toward the anode. In order to change the width of the bandgap of each light-emitting layer, the average particle size of the quantum dots in the light-emitting layer is controlled.

Figure 6:
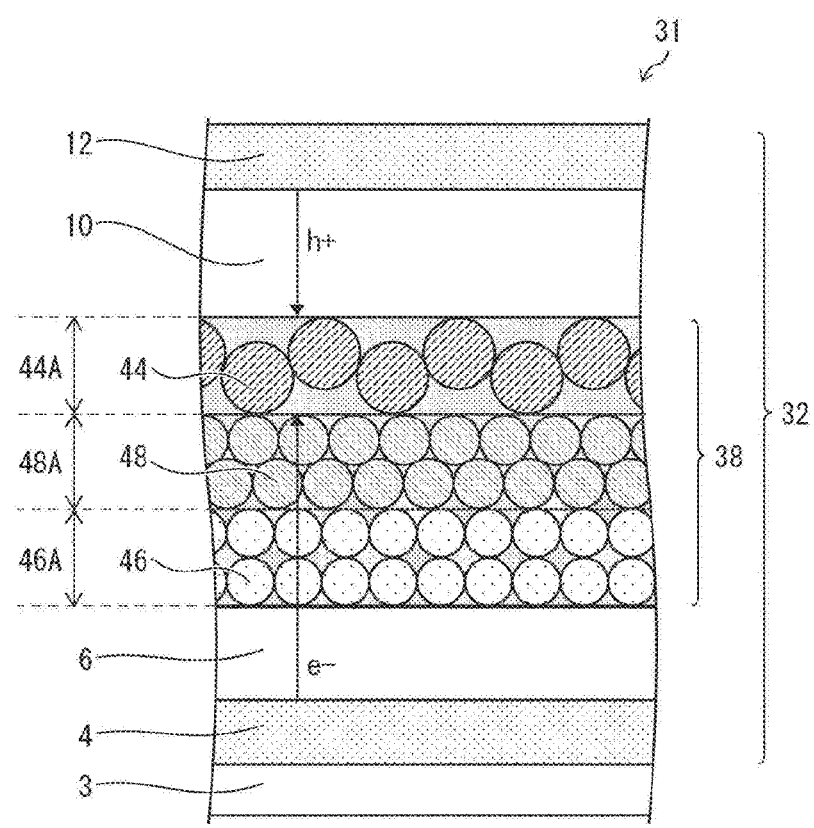
FIG. 6 is a schematic cross-sectional view of a light-emitting device according to a comparative embodiment.

FIG. 6 is a schematic cross-sectional view of a light-emitting device 31 including a light-emitting element 32 according to a comparative embodiment. In order to provide the light-emitting element 32 with a multiple quantum well structure, the average particle size of the quantum dots varies in each light-emitting layer. The light-emitting element 32 is the same in configuration as the light-emitting element 2 according to this embodiment except that the former includes the light-emitting layer 38 instead of the light-emitting layer 8.

The light-emitting layer 38 includes: a first light-emitting layer 44A provided closer to the hole-transport layer 10, and containing first quantum dots 44; and a second light-emitting layer 46A provided closer to the electron-transport layer 6 than to the first light-emitting layer 44A, and containing second quantum dots 46. In addition, in this embodiment, the light-emitting layer 38 includes a third light-emitting layer 48A containing third quantum dots 48, and provided between the first light-emitting layer 44A and the second light-emitting layer 46A.

As illustrated in FIG. 6, the first quantum dots 44 are larger in average particle size than the second quantum dots 46 and the third quantum dots 48. Note that the average particle size of the third quantum dots 48 is in between the average particle size of the first quantum dots 44 and the average particle size of the second quantum dots 46. Moreover, no difference in composition is found among the ligands coordinated to the first quantum dots 44, the second quantum dots 46, and the third quantum dots 48. Hence, no significant difference is found among the dipole moments of the ligands.

Figure 7:
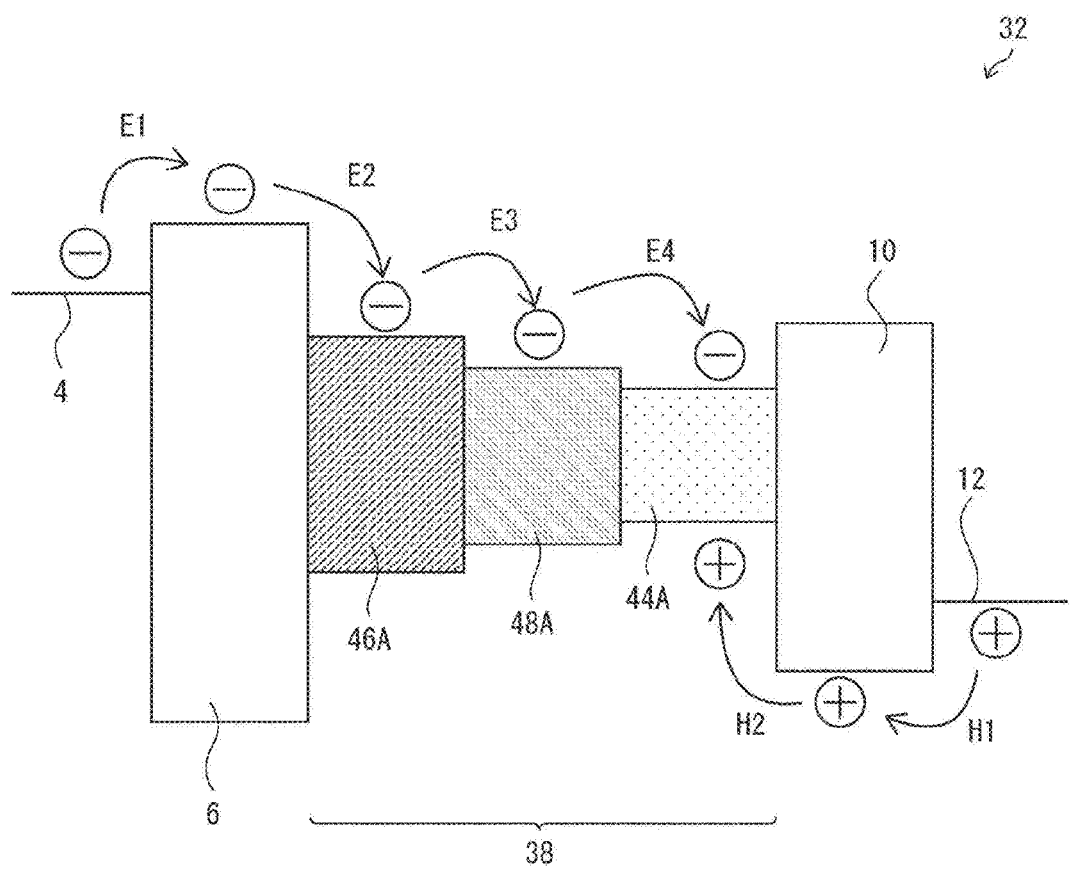
FIG. 7 is an energy band diagram illustrating a Fermi level or a bandgap of each of the layers included in a light-emitting element according to the comparative embodiment. The energy band diagram also illustrates how carriers are transported.

FIG. 7 is an energy band diagram illustrating a Fermi level or a bandgap of each of the layers included in the light-emitting element 32 according to the comparative embodiment. The average particle sizes of the quantum dots included in the light-emitting layer 38 increase in the order of the second quantum dots 46, the third quantum dots 48, and the first quantum dots 44. Hence, as illustrated in FIG. 7, the widths of the bandgaps of the layers in the light-emitting layer 38 decrease in the order of the second light-emitting layer 46A, the third light-emitting layer 48A, and the first light-emitting layer 44A.

Thus, as illustrated in FIG. 7, in the light-emitting element 32 according to the comparative embodiment, the light-emitting layer 38 is also provided practically with a multiple quantum well of the electrons. As a result, the electrons and the holes in the light-emitting element 32 are transported in a similar manner as those in the light-emitting element 2 according to this embodiment.

However, in the comparative embodiment, the average particle size of the first quantum dots 44 is larger than the average particle sizes of the second quantum dots 46 and the third quantum dots 48. Hence, the density of the first quantum dots 44 in the first light-emitting layer 44A is lower than the density of the second quantum dots 46 in the second light-emitting layer 46A and the density of the third quantum dots 48 in the third light-emitting layer 48A. In the first light-emitting layer 44 in which the electrons and the holes recombine together, the density of the first quantum dots 44 is low. This is why the efficiency in recombination of the electrons and the holes decreases, and, as a result, the light emission efficiency of the light-emitting element 32 decreases.

In this embodiment, the average particle size is the same between the first quantum dots 14, the second quantum dots 16, and the third quantum dots 18. Accordingly, the density of the quantum dots is also the same between the first light-emitting layer 14A, the second light-emitting layer 16A, and the third light-emitting layer 18A. Hence, in this embodiment, the light-emitting layer 8 can be provided with a multiple quantum well of the electrons, while maintaining the density of the first quantum dots 14 in the first light-emitting layer 14A.

As can be seen, the light-emitting element 2 according to this embodiment allows more efficient transportation of the carriers to, and recombination of the carriers in, the first light-emitting layer 14A. Hence, the light-emitting element 2 according to this embodiment further improves in light emission efficiency. The light-emitting device 1 provided with the light-emitting element 2 can improve in light emission efficiency.

Second Embodiment

Figure 8:
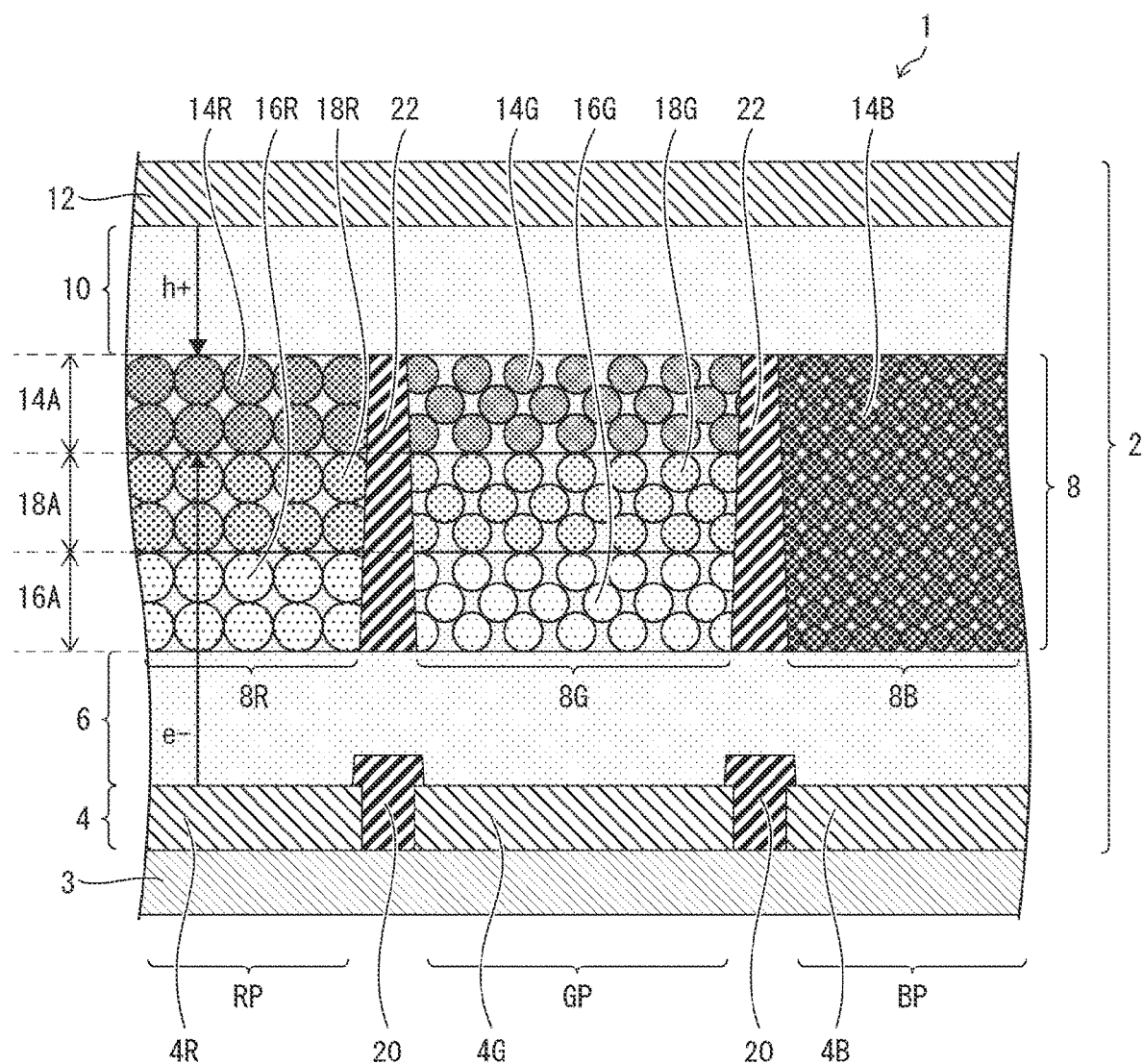
FIG. 8 is a schematic cross-sectional view of the light-emitting device according to a second embodiment of the disclosure.

FIG. 8 is a schematic cross-sectional view of the light-emitting device 1 according to this embodiment. The light-emitting element 2 according to this embodiment is different in configuration from the light-emitting element 2 according to the first embodiment in that the former includes a red sub-pixel RP, a green sub-pixel GP, and a blue sub-pixel BP.

As seen in the light-emitting element 2 according to the first embodiment, the light-emitting element 2 includes: the electron-transport layer 6; the light-emitting layer 8; the hole-transport layer 10; and the anode 12, all of which are provided on the cathode 4 in the stated order from below. Here, in this embodiment, the cathode 4 is divided with edge covers 20, and the light-emitting layer 8 is divided with banks 22.

In particular, in this embodiment, the cathode 4 is divided with the edge covers 20 into a cathode 4R, a cathode 4G, and a cathode 4B. Moreover, the light-emitting layer 8 is divided with the banks 22 into a red light-emitting layer 8R, a green light-emitting layer 8G, and a blue light-emitting layer 8B. Note that the electron-transport layer 6, the hole-transport layer 10, and the anode 12 are not divided with the edge covers 20 or the banks 22, but are formed in common. As illustrated in FIG. 8, the edge covers 20 may be positioned to cover side faces of, and circumferential end portions around top faces of, the cathode 4.

Moreover, in the light-emitting element 2 according to this embodiment, the red sub-pixel RP includes: the cathode 4R shaped into an island; the red light-emitting layer 8R shaped into an island; and the hole-transport layer 10, the electron-transport layer 6 and the anode 12 both formed in common. Likewise, the green sub-pixel GP includes: the cathode 4G shaped into an island; the green light-emitting layer 8G shaped into an island; and the hole-transport layer 10, the electron-transport layer 6 and the anode 12 both formed in common. Likewise, the blue sub-pixel BP includes: the cathode 4B shaped into an island; the blue light-emitting layer 8B shaped into an island; and the hole-transport layer 10, the electron-transport layer 6 and the anode 12 both formed in common.

In this embodiment, the red light-emitting layer 8R included in the red sub-pixel RP emits red light, the green light-emitting layer 8G included in the green sub-pixel GP emits green light, and the blue light-emitting layer 8B included in the blue sub-pixel BP emits blue light. That is, the light-emitting element 2 includes: a plurality of sub-pixels provided for one of wavelengths of light emitted from the light-emitting layer 8; and the cathode 4, the electron-transport layer 6, and the light-emitting layer 8 for each of the sub-pixels. Note that the light-emitting element 2 includes the hole-transport layer 10 and the anode 12 provided in common among all the sub-pixels.

Here, the blue light has a center wavelength in a wavelength band of, for example, 400 nm or more and 500 nm or less. Moreover, the green light has a center wavelength in a wavelength band of, for example, more than 500 nm and 600 nm or less. Furthermore, the red light has a center wavelength in a wavelength band of, for example, more than 600 nm and 780 nm or less.

In the light-emitting element 2 according to this embodiment, a group including one each of the red sub-pixels RP the green sub-pixels GP, and the blue sub-pixels BP may serve as one pixel of the light-emitting element 2. FIG. 8 illustrates only one pixel. Alternatively, in this embodiment, the light-emitting element 2 may include a plurality of pixels.

Except for the light-emitting layer 8, the layers of the light-emitting element 2 according to this embodiment may be formed of the same materials as those of the layers of the light-emitting element 2 according to the first embodiment. In this embodiment, each of the red light-emitting layer 8R and the green light-emitting layer 8G includes: the first light-emitting layer 14A provided closer to the hole-transport layer, the second light-emitting layer 16A provided closer to the electron-transport layer than to the first light-emitting layer 14A; and the third light-emitting layer 18A between the first light-emitting layer 14A and the second light-emitting layer 16A. Moreover, in this embodiment, the blue light-emitting layer 8B is a monolayer.

Here, the red light-emitting layer 8R according to this embodiment includes: first red quantum dots 14R in the first light-emitting layer 14A; second red quantum dots 16R in the second light-emitting layer 16A; and third red quantum dots 18R in the third light-emitting layer 18A. Likewise, the green light-emitting layer 8G includes: first green quantum dots 14G in the first light-emitting layer 14A; second green quantum dots 16G in the second light-emitting layer 16A; and third green quantum dots 18G in the third light-emitting layer 18A. Moreover, the blue light-emitting layer 8B includes blue quantum dots 14B.

The first red quantum dots 14R, the second red quantum dots 16R, and the third red quantum dots 18R emit red light. The first green quantum dots 14G, the second green quantum dots 16G, and the third green quantum dots 18G emit green light. The blue quantum dots 14B emit blue light.

Each of the quantum dots included in the light-emitting layer 8 may have a core/shell structure including the core 8C and the shell 8S described above. Moreover, the average particle size of the quantum dots in the red light-emitting layer 8R is the same. Likewise, the average particle size of the quantum dots in the green light-emitting layer 8G is the same.

Here, the average particle size of the quantum dots in the red light-emitting layer 8R is larger than the average particle size of the quantum dots in the green light-emitting layer 8G and the average particle size of the blue quantum dots 14B. Furthermore, the average particle size of the quantum dots in the green light-emitting layer 8G is larger than the average particle size of the blue quantum dots 14B.

The first ligands 14L are coordinated to the shell 8S of a second red quantum dot 16R and of a second green quantum dot 16G. Likewise, the second ligands 16L are coordinated to the shell 8S of a second red quantum dot 16R and of a second green quantum dot 16G. Moreover, the third ligands 18L are coordinated to the shell 8S of a third red quantum dot 18R and of a third green quantum dot 18G. Note that known ligands including any of the above ligands may be coordinated to the shell 8S of a blue quantum dot 14B.

Figure 9:
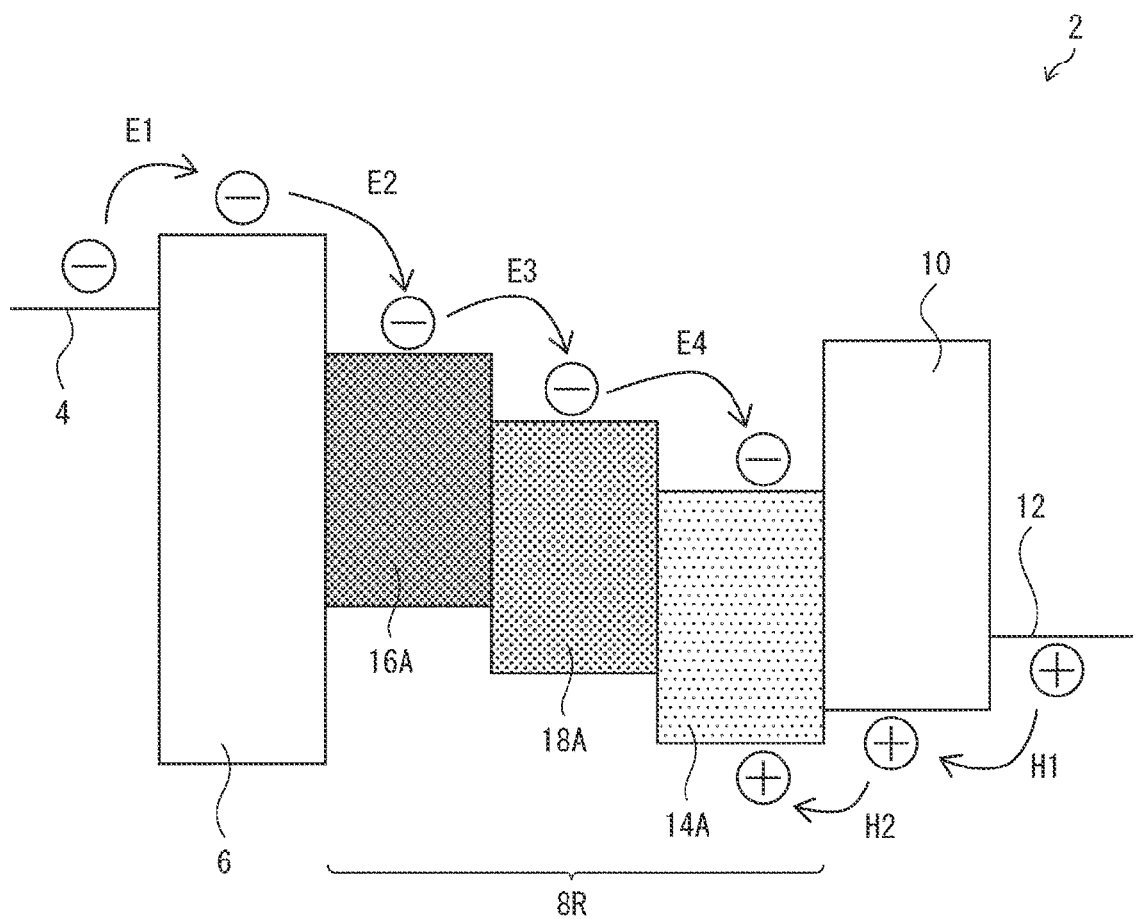
FIG. 9 is an energy band diagram illustrating a Fermi level or a bandgap of each of the layers included in the light-emitting element according to the second embodiment of the disclosure. The energy band diagram also illustrates how carriers are transported. The energy band diagram relates in particular to a red sub-pixel.

FIG. 9 is an energy band diagram illustrating a Fermi level or a bandgap of each of the layers included in the light-emitting element 2 according to this embodiment. The energy band diagram relates in particular to the red sub-pixel RP.

In this embodiment, as described above, the average particle size is the same among the quantum dots in the red light-emitting layer 8R as described above. Hence, as clearly seen in FIG. 9, the width of the bandgap is also the same between the first light-emitting layer 14A, the second light-emitting layer 16A, and the third light-emitting layer 18A.

Moreover, because of the same reason described above, in the energy band diagram in FIG. 9, the bottom of the conduction band of the first light-emitting layer 14A is lower than the bottom of the conduction band of the second light-emitting layer 16A, and the top of the valence band of the first light-emitting layer 14A is lower than the top of the valence band of the second light-emitting layer 16A. Furthermore, in the energy band diagram in FIG. 9, the bottom of the conduction band of the third light-emitting layer 18A is in between the bottom of the conduction band of the first light-emitting layer 14A and the bottom of the conduction band of the second light-emitting layer 16A. Likewise, the top of the valence band of the third light-emitting layer 18A is in between the top of the valence band of the first light-emitting layer 14A and the top of the valence band of the second light-emitting layer 16A.

Hence, in the red sub-pixel RP of the light-emitting element 2 according to this embodiment, the level to the top of the bandgap gradually decreases from the electron-transport layer 6 to the first light-emitting layer 14A. Moreover, also in this embodiment, a value of the level of the bottom of the conduction band of the first light-emitting layer 14A is smaller than a value of a LUMO level of the hole-transport layer 10. Hence, in this embodiment, the red light-emitting layer 8R is provided practically with a multiple quantum well of the electrons. As a result, as illustrated in FIG. 9, the electrons and the holes are transported also in the red sub-pixel RP of the light-emitting element 2 according to this embodiment, as the electrons and the holes are transported in the light-emitting element 2 according to the first embodiment.

Note that the green light-emitting layer 8G is also provided with a multiple quantum well of the electrons as the red light-emitting layer 8R is, because of the same reason described above. Hence, the electrons and the holes are transported also in the green sub-pixel GP of the light-emitting element 2 according to this embodiment, as the holes and the electrons are transported in the red sub-pixel RP illustrated in FIG. 9.

Figure 10:
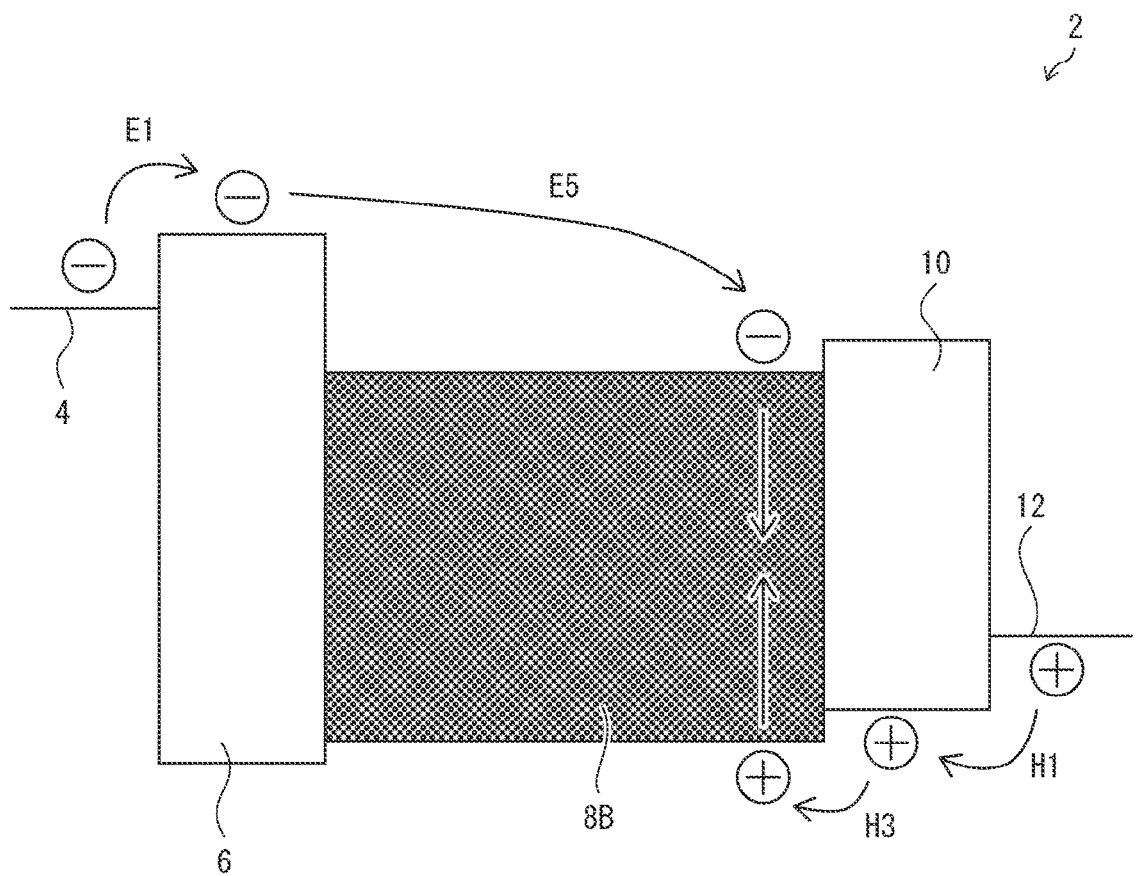
FIG. 10 is an energy band diagram illustrating a Fermi level or a bandgap of each of the layers included in the light-emitting element according to the second embodiment of the disclosure. The energy band diagram also illustrates how carriers are transported. The energy band diagram relates in particular to a blue sub-pixel.

FIG. 10 is an energy band diagram illustrating a Fermi level or a bandgap of each of the layers included in the light-emitting element 2 according to this embodiment. The energy band diagram relates in particular to the blue sub-pixel BP.

As described above, in this embodiment, the blue light-emitting layer 8B is a monolayer including the blue quantum dots 14B alone. Hence, as illustrated in FIG. 10, the electrons from the electron-transport layer 6 are directly injected into the blue light-emitting layer 8B as indicated by an arrow E5, and the holes from the hole-transport layer 10 are directly injected into the blue light-emitting layer 8B as indicated by an arrow H3. Note that, in the blue light-emitting layer 8B, the mobility of the electrons is higher than the mobility of the holes. Hence, in the blue light-emitting layer 8B, the recombination of the electrons and the holes occurs closer to the hole-transport layer 10.

In this embodiment, too, the red light-emitting layer 8R and the green light-emitting layer 8G can be provided with a multiple quantum well of the electrons, while maintaining the density of the first red quantum dots 14R and the first green quantum dots 14G in the first light-emitting layer 14A. Hence, in the light-emitting element 2 according to this embodiment, the red sub-pixel RP and the green sub-pixel GP further improve in light emission efficiency.

Note that the difference may be 0.2 eV or less between: the level of the bottom of the conduction band of the second light-emitting layer 16A in the red light-emitting layer 8R and the green light-emitting layer 8G; and the level of the bottom of the conduction band of the blue light-emitting layer 8B. Such a feature makes it possible to form the electron-transport layer 6 in common between the red sub-pixel RP, the green sub-pixel GP, and the blue sub-pixel BP, while maintaining substantially constant efficiency in injecting the electrons from the electron-transport layer 6 into the light-emitting layers.

Likewise, the difference may be 0.2 eV or less between: the level of the top of the valence band of the first light-emitting layer 14A in the red light-emitting layer 8R and the green light-emitting layer 8G; and the level of the top of the valence band of the blue light-emitting layer 8B. Such a feature makes it possible to form the hole-transport layer 10 in common between the red sub-pixel RP, the green sub-pixel GP, and the blue sub-pixel BP, while maintaining substantially constant efficiency in injecting the holes from the hole-transport layer 10 into the light-emitting layers.

When the electron-transport layer 6 and the hole-transport layer 10 are formed in common among the sub-pixels, a step of forming the electron-transport layer 6 and the hole-transport layer 10 can be simplified in a step of producing the light-emitting element 2. Hence, production costs of the light-emitting element 2 can be reduced.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A light-emitting element, comprising:
a cathode; an anode; a light-emitting layer provided between the cathode and the anode and containing quantum dots; an electron-transport layer provided between the light-emitting layer and the cathode; and a hole-transport layer provided between the light-emitting layer and the anode, wherein
the light-emitting layer includes a first light-emitting layer containing first quantum dots to which first ligands are coordinated,
the light-emitting layer further includes a second light-emitting layer provided closer to the electron-transport layer than to the first light-emitting layer, and containing second quantum dots to which second ligands are coordinated,
a dipole moment of the first ligands is larger than a dipole moment of the second ligands, and
the first ligands are expressed by a formula (1), a formula (2), a formula (3), a formula (4), or a formula (5) below:

[formula 1]

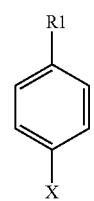

(1)

wherein, in the formula (1),
X represents a functional group selected from a thiol group, a carboxyl group, and an amino group, and coordinated to the first quantum dots, and
R1 has a nitrogen-containing aromatic ring selected from at least one of a carbazole skeleton, an acridine skeleton, a phenoxazone skeleton, and a phenazine skeleton, and a nitrogen atom forming the nitrogen-containing aromatic ring binds to a benzene ring expressed by the formula (1);

[formula 2]

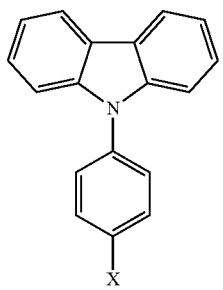

(2)

wherein, in the formula (2),
X represents a functional group selected from a thiol group, a carboxyl group, and an amino group, and coordinated to the first quantum dots;

[formula 3]

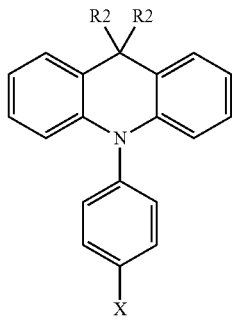

(3)

wherein, in the formula (3),
X represents a functional group selected from a thiol group, a carboxyl group, and an amino group, and coordinated to the first quantum dots, and
R2s are equal to, or different from, each other, and are selected from hydrogen atoms, an alkyl group, and a phenyl group;

[formula 4]

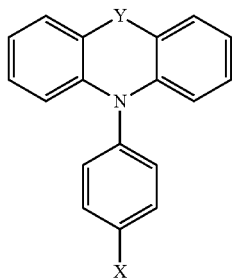

(4)

wherein, in the formula (4),
X represents a functional group selected from a thiol group, a carboxyl group, and an amino group, and coordinated to the first quantum dots, and
Y represents an atom of O or an atom of S; and

[formula 5]

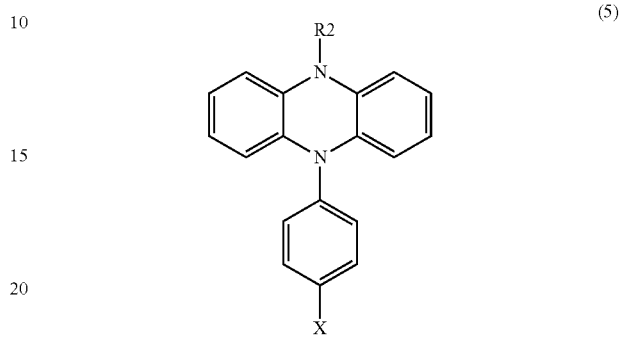

(5)

wherein, in the formula (5),
X represents a functional group selected from a thiol group, a carboxyl group, and an amino group, and coordinated to the first quantum dots, and
R2 is selected from a hydrogen atom, an alkyl group, and a phenyl group.

2. The light-emitting element according to claim 1, wherein
the dipole moment of the first ligands is positive, and the dipole moment of the second ligands is negative.

3. The light-emitting element according to claim 1, wherein
the first light-emitting layer and the second light-emitting layer are adjacent to each other.

4. The light-emitting element according to claim 1, wherein
the first light-emitting layer and the hole-transport layer are adjacent to each other.

5. The light-emitting element according to claim 1, wherein
the second light-emitting layer and the electron-transport layer are adjacent to each other.

6. The light-emitting element according to claim 1, wherein
a value of a level of a bottom of a conduction band of the first light-emitting layer is smaller than a value of a LUMO level of the hole-transport layer.

7. A light-emitting element, comprising:
a cathode; an anode; a light-emitting layer provided between the cathode and the anode and containing quantum dots; an electron-transport layer provided between the light-emitting layer and the cathode; and a hole-transport layer provided between the light-emitting layer and the anode, wherein
the light-emitting layer includes a first light-emitting layer containing first quantum dots to which first ligands are coordinated,
the light-emitting layer further includes a second light-emitting layer provided closer to the electron-transport layer than to the first light-emitting layer, and containing second quantum dots to which second ligands are coordinated,
a dipole moment of the first ligands is larger than a dipole moment of the second ligands, and
the second ligands are expressed by a formula (6), a formula (7), a formula (8), a formula (9), a formula (10), or a formula (11) below:

[formula 6]

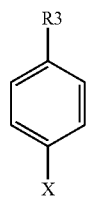

(6)

wherein, in the formula (6),
X represents a functional group selected from a thiol group, a carboxyl group, and an amino group, and coordinated to the second quantum dots, and
R3 is selected from any one or more of functional groups including a triazole skeleton, a triazine skeleton, a thiophene skeleton, a furan skeleton, a thiazole skeleton, an oxazole skeleton, an oxadiazole skeleton, and a thiadiazole skeleton;

[formula 7]

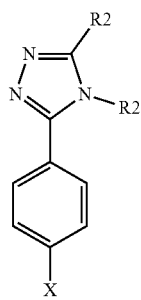

(7)

wherein, in the formula (7),
X represents a functional group selected from a thiol group, a carboxyl group, and an amino group, and coordinated to the second quantum dots, and
R2s are equal to, or different from, each other, and are selected from hydrogen atoms, an alkyl group, and a phenyl group;

[formula 8]

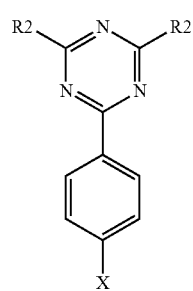

(8)

wherein, in the formula (8),
X represents a functional group selected from a thiol group, a carboxyl group, and an amino group, and coordinated to the second quantum dots, and
R2s are equal to, or different from, each other, and are selected from hydrogen atoms, an alkyl group, and a phenyl group;

[formula 9]

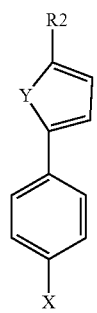

(9)

wherein, in the formula (9),
X represents a functional group selected from a thiol group, a carboxyl group, and an amino group, and coordinated to the second quantum dots,
R2 is selected from a hydrogen atom, an alkyl group, and a phenyl group, and
Y represents an atom of O or an atom of S;

[formula 10]

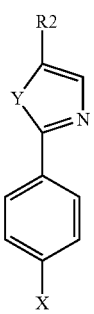

(10)

wherein, in the formula (10),

X represents a functional group selected from a thiol group, a carboxyl group, and an amino group, and coordinated to the second quantum dots, R2 is selected from a hydrogen atom, an alkyl group, and a phenyl group, and Y represents an atom of O or an atom of S; and

[formula 11]

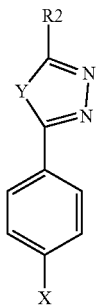

(11)

wherein, in the formula (11),

X represents a functional group selected from a thiol group, a carboxyl group, and an amino group, and coordinated to the second quantum dots, R2 is selected from a hydrogen atom, an alkyl group, and a phenyl group, and Y represents an atom of O or an atom of S.

8. A light-emitting element, comprising:
a cathode; an anode; a light-emitting layer provided between the cathode and the anode and containing quantum dots; an electron-transport layer provided between the light-emitting layer and the cathode; and a hole-transport layer provided between the light-emitting layer and the anode, wherein
the light-emitting layer includes a first light-emitting layer containing first quantum dots to which first ligands are coordinated, the light-emitting layer further includes a second light-emitting layer provided closer to the electron-transport layer than to the first light-emitting layer, and containing second quantum dots to which second ligands are coordinated, and a dipole moment of the first ligands is larger than a dipole moment of the second ligands, wherein the light-emitting layer further includes a third light-emitting layer containing third quantum dots to which third ligands are coordinated, and provided between the first light-emitting layer and the second light-emitting layer, a dipole moment of the third ligands is smaller than the dipole moment of the first ligands, and is larger than the dipole moment of the second ligands, and the third ligands are expressed by a formula (12) below:

[formula 12]

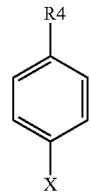

(12)

wherein, in the formula (12),

X represents a functional group selected from a thiol group, a carboxyl group, and an amino group, and coordinated to the third quantum dots, and R4 is selected from a phenyl group and a biphenyl group.

9. A light-emitting device including one or more of light-emitting elements including the light-emitting element according to claim 1.

* * * * *